(12) United States Patent
Seidel et al.

(10) Patent No.: US 8,163,594 B2
(45) Date of Patent: Apr. 24, 2012

(54) SEMICONDUCTOR DEVICE COMPRISING A CARBON-BASED MATERIAL FOR THROUGH HOLE VIAS

(75) Inventors: Robert Seidel, Dresden (DE); Frank Feustel, Dresden (DE); Ralf Richter, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 87 days.

(21) Appl. No.: 12/505,098

(22) Filed: Jul. 17, 2009

(65) Prior Publication Data

US 2010/0052110 A1 Mar. 4, 2010

(30) Foreign Application Priority Data

Aug. 29, 2008 (DE) .................... 10 2008 044 985

(51) Int. Cl.
*H01L 21/31* (2006.01)
(52) U.S. Cl. ....... 438/99; 438/758; 257/40; 257/E51.04; 977/42
(58) Field of Classification Search .............. 257/40, 257/E51.04; 438/99, 758; 977/42
See application file for complete search history.

(56) References Cited

U.S. PATENT DOCUMENTS

| 7,094,679 | B1 | 8/2006 | Li et al. ................ 438/618 |
| 7,335,603 | B2* | 2/2008 | Mancevski ............. 438/758 |
| 2001/0023986 | A1* | 9/2001 | Mancevski ............. 257/741 |
| 2005/0064707 | A1 | 3/2005 | Sinha ..................... 438/667 |
| 2006/0043598 | A1 | 3/2006 | Kirby et al. ............ 257/774 |
| 2006/0064707 | A1 | 3/2006 | Yang et al. ............. 720/623 |
| 2006/0223301 | A1 | 10/2006 | Vanhaelemeersch ......... 438/618 |
| 2008/0029851 | A1 | 2/2008 | Kirby et al. .................... 257/621 |
| 2008/0081386 | A1 | 4/2008 | Raravikar et al. ............... 438/15 |
| 2008/0179590 | A1* | 7/2008 | Mancevski ....................... 257/40 |

FOREIGN PATENT DOCUMENTS

| DE | 103 45 393 A1 | 5/2005 |
| DE | 102005004365 A1 | 8/2006 |
| EP | 1 906 441 A1 | 4/2008 |

OTHER PUBLICATIONS

Translation of Official Communication from German Patent Office for German Patent Application No. 10 2008 044 985.7-33 dated Apr. 19, 2009.
Xu et al., "Through-wafer interconnects using carbon nanotubes synthesized by chemical vapor deposition," *Proceedings of the 3rd IEEE Int. Conf. on Nano/Micro Engineered and Molecular Systems*, pp. 471-475, Jan. 6-9, 2008.
PCT International Search Report from PCT/EP2009/006262 dated Oct. 27, 2009.
International Preliminary Report on Patentability from PCT/EP2009/006262 dated Mar. 10, 2011.

* cited by examiner

*Primary Examiner* — Fernando L Toledo
(74) *Attorney, Agent, or Firm* — Williams, Morgan & Amerson

(57) ABSTRACT

In a semiconductor device, a through hole via extending through the substrate of the device may be formed on the basis of a carbon-containing material, thereby providing excellent compatibility with high temperature processes, while also providing superior electrical performance compared to doped semiconductor materials and the like. Thus, in some illustrative embodiments, the through hole vias may be formed prior to any process steps used for forming critical circuit elements, thereby substantially avoiding any interference of the through hole via structure with a device level of the corresponding semiconductor device. Consequently, highly efficient three-dimensional integration schemes may be realized.

16 Claims, 6 Drawing Sheets

SEMICONDUCTOR DEVICE COMPRISING A CARBON-BASED MATERIAL FOR THROUGH HOLE VIAS

BACKGROUND OF THE INVENTION

1. Field of the Invention

The present disclosure generally relates to the field of fabricating integrated circuits, and, more particularly, to interconnect structures for connecting different device levels by vias extending through the substrate material of the devices.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are continuously decreased with the introduction of every new circuit generation to provide currently available integrated circuits formed by volume production techniques with critical dimensions of 50 nm or less and having an improved degree of performance in terms of speed and/or power consumption. A reduction in size of transistors is an important aspect in steadily improving device performance of complex integrated circuits, such as CPUs. The reduction in size is commonly associated with an increased switching speed, thereby enhancing signal processing performance at transistor level.

In addition to the large number of transistor elements, a plurality of passive circuit elements, such as capacitors, resistors, interconnect structures and the like, are typically formed in integrated circuits as required by the basic circuit layout. Due to the decreased dimensions of the active circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC).

Although transistor elements are the dominant circuit element in highly complex integrated circuits which substantially determine the overall performance of these devices, other components such as capacitors and resistors, and in particular a complex interconnect system or metallization system, may be required, wherein the size of these passive circuit elements may also have to be adjusted with respect to the scaling of the transistor elements in order to not unduly consume valuable chip area.

Typically, as the number of circuit elements, such as transistors and the like, per unit area may increase in the device level of a corresponding semiconductor device, the number of electrical connections associated with the circuit elements in the device level may also be increased, typically even in an over-proportional manner, thereby requiring complex interconnect structures which may be provided in the form of metallization systems including a plurality of stacked metallization layers. In these metallization layers, metal lines, providing the inner-level electrical connection, and vias, providing the intra-level connections, may be formed on the basis of highly conductive metals, such as copper and the like, in combination with appropriate dielectric materials to reduce the parasitic RC (resistive capacitive) time constants, since, in sophisticated semiconductor devices, typically, signal propagation delay may substantially be restricted by a metallization system rather than the transistor elements in the device level.

However, expanding the metallization system in the height dimension to provide the desired density of interconnect structures may be restricted by the parasitic RC time constants and the effects imposed by the material characteristics of sophisticated low-k dielectrics. That is, typically, a reduced dielectric constant is associated with reduced mechanical stability of these dielectric materials, thereby also restricting the number of metallization layers that may be stacked on top of each other in view of yield losses during the various fabrication steps and the reduced reliability during operation of the semiconductor device. Thus, the complexity of semiconductor devices provided in a single semiconductor chip may be restricted by the capabilities of the corresponding metallization system and in particular by the characteristics of sophisticated low-k dielectric materials, since the number of metallization layers may not be arbitrarily increased. For this reason, it has also been proposed to further enhance the overall density of circuit elements for a given size or area of a respective package by stacking two or more individual semiconductor chips, which may be fabricated in an independent manner, however, with a correlated design to provide in total a complex system while avoiding many of the problems encountered during the fabrication process for extremely complex semiconductor devices on a single chip. For example, appropriately selected functional units, such as memory areas and the like, may be formed on a single chip in accordance with well-established manufacturing techniques including the fabrication of a corresponding metallization system, while other functional units, such as a fast and powerful logic circuitry, may be formed independently as a separate chip wherein, however, respective interconnect systems may enable a subsequent stacking and attaching of the individual chips to form an overall functional circuit, which may then be packaged as a single unit. Thus, a corresponding three-dimensional configuration may provide increased density of circuit elements and metallization features with respect to a given area of a package, since a significant larger amount of the available volume in a package may be used by stacking individual semiconductor chips. Although this technique represents a promising approach for enhancing packing density and functionality for a given package size for a given technology standard while avoiding extremely critical manufacturing techniques, for instance in view of stacking a large number of highly critical metallization layers, appropriate contact elements may have to be provided to enable the electrical connections of the individual semiconductor chips in a reliable and well-performing manner. To this end, it has been suggested to form through hole vias through the substrate material of at least one of the chips to enable electrical contact to respective contact elements of a second semiconductor chip, while the metallization system of the first semiconductor chip may further be available for connecting to other semiconductor chips or a package substrate and the like. These through hole vias may typically represent contact elements of a high aspect ratio, since the lateral dimensions of these vias may also be reduced in view of saving valuable chip area, while, on the other hand, the thickness of the substrate material may not be arbitrarily reduced. Additionally, in view of electrical performance, the conductivity of the through hole vias should be maintained at a high level to accommodate the required high current densities and also reduce signal propagation delay in systems in which exchange of electrical signals between individual semiconductor chips may have to be accomplished on the basis of moderately high clock frequencies.

In view of this situation, in conventional approaches, the corresponding high aspect ratio through hole vias may be formed on the basis of well-established manufacturing techniques also known from the fabrication of contact structures and metallization systems, which may involve the etching of respective openings, such as via openings and trenches, in a moderately thin dielectric material and the subsequent filling of these openings with metal-containing materials, such as copper in combination with conductive barrier materials, such as titanium nitride, tungsten and the like. By transferring corresponding technology to a fabrication sequence for through hole vias, appropriate high conductivity values may be obtained in conformity with requirements with respect to enhanced electrical performance. However, since the temperature stability of these materials may be inferior, typically these process steps may have to be performed at a very advanced manufacturing stage, i.e., after any high temperature processes that may usually be required during the formation of circuit elements, such as transistors, in the device level. Thus, the manufacturing steps involved in forming the high aspect ratio openings for the through hole vias and the subsequent filling in of a highly conductive material may significantly affect the overall process flow and may have an adverse influence on the circuit elements in the device level. For example, sophisticated etch and masking regimes may have to be used to etch through the substrate, which may thus also affect any circuit element that may have already been formed in the device level at this manufacturing stage.

On the other hand, conductive materials exhibiting a moderately high temperature stability, such as doped polysilicon, may exhibit an inferior conductivity so that forming the corresponding through hole vias at an early manufacturing stage on the basis of temperature stable polysilicon material may be less than desirable in view of electrical performance of the resulting interconnect structure.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and techniques in which through hole vias may be formed on the basis of a carbon-containing conductive material, which may exhibit a high temperature stability, thereby providing a high degree of flexibility in appropriately implementing the process of forming the through hole vias into the overall manufacturing flow of the semiconductor device. For instance, in some illustrative aspects disclosed herein, the through hole vias may be formed prior to any manufacturing steps for forming circuit elements in the device level and in the metallization system of the device, thereby substantially completely avoiding any negative influence of the manufacturing sequence for forming the through hole vias. On the other hand, the carbon-containing conductive material, which may be provided, in some illustrative embodiments, as a substantially pure carbon material, except for process-induced imperfections, may have excellent temperature stability so that any high temperature processes during the subsequent manufacturing processes for forming the circuit elements and the metallization system may not substantially negatively influence the electrical and chemical characteristics of the through hole via. On the other hand, the carbon-containing material may be deposited on the basis of well-established deposition techniques which exhibit a high degree of compatibility with other manufacturing techniques used during the formation of circuit elements so that, in other cases, the fabrication of the through hole vias may be positioned at any appropriate stage of the overall manufacturing flow, however, independent from any constraints with respect to high temperature steps, as may be the case in conventional approaches when forming highly conductive through hole vias. Thus, the intrinsically high conductivity of the carbon-containing conductive material, which may have specific resistivity of approximately 2 milliohm cm or less, in combination with well-established characteristics of the carbon material with respect to deposition and also with respect to patterning the material, may provide enhanced flexibility in providing through hole vias, substantially without negatively affecting other process steps during the formation of circuit elements.

One illustrative semiconductor device disclosed herein comprises a substrate having a front side and a back side and a plurality of circuit elements formed in and above a semiconductor layer that is provided above the front side. Additionally, the semiconductor device comprises a through hole via formed in the substrate so as to extend at least to the back side, wherein the through hole via comprises a carbon-based material as a conductive fill material.

One illustrative method disclosed herein comprises forming an opening in a substrate of a semiconductor device, wherein the opening extends from a front side of the substrate to a back side thereof. Furthermore, the opening is filled with a conductive material that comprises carbon and, additionally, circuit elements are formed in and above the front side of the substrate.

A further illustrative method disclosed herein comprises forming an opening into a front side of a substrate of a semiconductor device, wherein the opening extends into the substrate. Additionally, the method comprises filling the opening with a carbon-containing conductive material and removing material of the substrate from a back side thereof to expose a bottom of the opening and the carbon-containing conductive material. Finally, the method comprises forming circuit elements above the front side.

BRIEF DESCRIPTION OF THE DRAWINGS

The disclosure may be understood by reference to the following description taken in conjunction with the accompanying drawings, in which like reference numerals identify like elements, and in which.

Figure 1A:
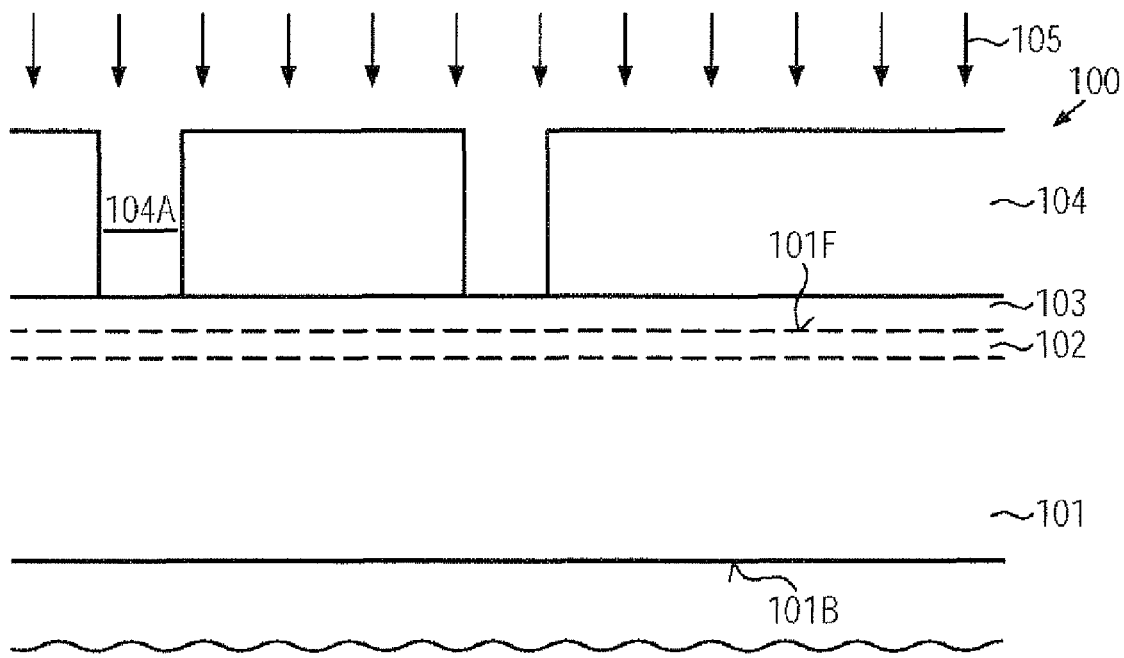
FIGS. 1a-1d schematically illustrate cross-sectional views of a substrate for forming semiconductor devices thereon during various manufacturing stages in forming through hole vias on the basis of a carbon material, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure relates to semiconductor devices and techniques in which through hole vias, i.e., high aspect ratio contact elements, may be formed on the basis of a highly conductive material on the basis of carbon, which may exhibit excellent deposition characteristics and which may also be readily patterned by well-established etch and planarization techniques, while, additionally, the superior characteristics with respect to temperature stability may provide a high degree of flexibility in appropriately implementing the manufacturing process of forming the through hole vias into the overall manufacturing flow for forming complex integrated circuits. In some illustrative aspects disclosed herein, the through hole vias may be efficiently used in the context of three-dimensional integration of individual semiconductor chips, wherein through hole vias may be formed in one or more of the individual semiconductor chips at any appropriate manufacturing stage, for instance prior to performing critical manufacturing steps for circuit elements, such as transistors, metallization structures and the like, thereby substantially avoiding any interference of manufacturing processes regarding the through hole vias and the critical circuit elements. In one illustrative embodiment, the through hole vias, or at least a significant portion thereof, may be provided prior to actually performing any process steps for defining transistor elements in the device level of the corresponding semiconductor substrate, since the superior temperature stability of the carbon material in the through hole vias or portions thereof may provide substantially constant characteristics of the through hole vias even after any high temperature steps required during the formation of transistors and the like. Moreover, due to the availability of highly efficient deposition techniques for carbon material, for instance by decomposition of carbon-containing precursor gases, in addition to the intrinsically high conductivity of carbon material, which may be significantly higher compared to, for instance, highly doped polysilicon, additional design flexibility may be obtained by appropriately adapting the size of individual through hole vias, since the corresponding lateral dimensions thereof may not be substantially determined by deposition-related constraints and a reduced conductivity, as may be the case in polysilicon related approaches. Thus, complex "interconnect structures" may be established on the basis of the carbon-containing through hole vias with lateral dimensions adapted to electrical performance and/or spatial constraints, thereby also enabling increased complexity of composite semiconductor devices at a reduced area consumption, since an increased number of through hole vias may be positioned across the chip area of one or more of the components. For instance, the through hole vias of one semiconductor device, which may be directly connected to circuit elements in the device level, for instance transistors and the like, may directly connect to the metallization system of a further semiconductor chip, while, in other cases, the through hole via interconnect structure of one component may connect to the through hole via interconnect structure of another component, which may be accomplished on the basis of appropriate bump structures and the like, while both metallization systems may be available for connecting to the periphery or other semiconductor chips. In still other illustrative embodiments, the enhanced design flexibility of the through hole vias on the basis of a carbon material may provide the possibility of efficiently adding an additional metallization system to a semiconductor chip, which may be fabricated on a separate substrate, thereby reducing the complexity and thus the probability of creating yield losses of the actual chip internal metallization system.

FIG. 1*a* schematically illustrates a cross-sectional view of a semiconductor device 100 in an early manufacturing stage. As shown, the semiconductor device 100 may comprise a substrate 101, of which a certain portion is illustrated, in which an advanced interconnect structure on the basis of through hole vias is to be formed. The substrate 101 may represent any appropriate carrier material, for instance a semiconductor material such as silicon, germanium and the like. The substrate 101 may represent an insulating carrier material, such as glass and the like. Furthermore, a semiconductor layer 103, such as a silicon-based material, a silicon/germanium material, or any other appropriate semiconductor compound, may be formed above the substrate 101, wherein, in some cases, the semiconductor layer 103 may represent an upper portion of a crystalline material, such as an epitaxially grown semiconductor material, which may be formed on the basis of a crystalline template material of the substrate 101 when provided in the form of a semiconductor material. In some illustrative embodiments, as shown, the substrate 101 and the semiconductor layer 103 may comprise a substantially crystalline semiconductor material, which may be separated by an insulating layer 102, which is frequently referred to as a buried insulating layer, thereby defining a silicon-on-insulator (SOI) configuration. It should be appreciated, however, that a plurality of different substrate configurations may typically be used during the fabrication of semiconductor devices, such as hybrid substrates, in which different crystallographic characteristics of the semiconductor material 103 may be provided, or different crystallographic configurations of the substrate material and the semiconductor layer 103 may be used with respect to certain characteristics during the manufacturing of the device 100 and the like. Similarly, a desired type of strain may be provided in the semiconductor layer 103, depending on the overall device and process requirements. It should be appreciated that the dimensions of the components described so far may not be true to scale, since typically the substrate 101 may be significantly thicker compared to the semiconductor layer 103 and the buried insulating layer 102, if provided. For example, the substrate 101 may have a thickness of several hundred micrometers, while the semiconductor layer 103 may have a thickness of several micrometers and significantly less, depending on the circuit elements to be formed in and above the semiconductor layer 103. In the following, it may also be referred to a front side 101F of the substrate 101 and a back side 101B, wherein this definition of front side and back side may refer to the position of the semiconductor layer 103, in and above which the majority of circuit elements, such as transistors and the like, is to be formed during the further processing of the device 100. It should further be appreciated that any positional statements, such as "above," "below," "lateral" and the like, are to be considered as referring to an appropriate reference component, such as the front side 101F and the back side 101B. For instance, it may generally be assumed herein that a positional statement may refer to one of these two reference planes 101F, 101B. For instance, the semiconductor layer 103 may be positioned "above" the front side 101F while the buried insulating layer 102, if provided and if considered as a part of the substrate 101, may be considered as being positioned "below" the front side 101F. Similarly, any component, such as the material layer, formed at the back side 101B may thus be positioned "above" the back side 101B.

Moreover, in one illustrative embodiment, significant process steps for semiconductor elements, such as patterning the semiconductor layer 103, ion implantation of dopant species and the like, may not have been performed so as to substantially avoid any interaction of subsequent process steps to be performed to fabricate a corresponding through hole via interconnect system. In other cases, some manufacturing steps may be performed prior to forming respective through hole vias or some of the manufacturing steps may be performed commonly with at least some of the steps required for providing the through hole vias. In the manufacturing stage shown, an appropriate etch mask may be provided to define the position and the lateral size of corresponding openings for the through hole vias still to be formed. For instance, the etch mask 104 may be comprised of a resist material, possibly in combination with a hard mask material, while, in other cases, an appropriate hard mask material, such as silicon nitride, silicon dioxide, silicon carbide and the like, may be patterned on the basis of a resist material, which may be removed afterwards. Thus, corresponding openings 104A may be formed with an appropriate lateral dimension at corresponding positions at which through hole vias are to be formed so as to extend through the substrate 101. As previously explained, due to the superior electrical characteristics of carbon material and in particular due to the deposition behavior, which may allow reliably filling of openings of even extremely high aspect ratios, the lateral sizes of the openings 104A may be selected in view of design criteria rather than in view of process-related aspects. Consequently, the openings 104A may typically be provided with a lateral size of approximately 10-50 μm, while a position of the corresponding openings 104A may be selected with respect to a reduction of the overall complexity of a corresponding interconnect structure, which may electrically connect circuit elements still to be formed in and above the semiconductor layer 103 with one or more of the through hole vias. For example, due to the high degree of compatibility of the carbon-based material in view of process techniques to be used during the formation of transistors and the like, close proximity of respective through hole vias to actual circuit elements may not substantially negatively affect the circuit elements, thereby reducing the overall complexity of a corresponding circuit layout.

Typically, the semiconductor device 100 as shown in FIG. 1a may be formed on the basis of well-established process techniques involving deposition and patterning regimes for providing the etch mask 104 having the openings 104A in accordance with the design rules. Next, the device 100 may be exposed to an etch ambient 105 so as to etch through the semiconductor layer 103, the buried insulating layer 102, if provided, and into and through the substrate 101. For instance, a plurality of highly anisotropic etch techniques for etching through silicon material and germanium material are available in the art and may be used. That is, plasma assisted etch techniques, for instance on the basis of fluorine, chlorine and the like, may be readily used for etching through the substrate 101 selectively to the etch mask 104. It should be appreciated that an appropriate "etch stop" material may be positioned above the back side 101B, for instance in the form of any appropriate carrier material for positioning thereon the substrate 101, or by forming a corresponding sacrificial material layer and the like.

Figure 1B:
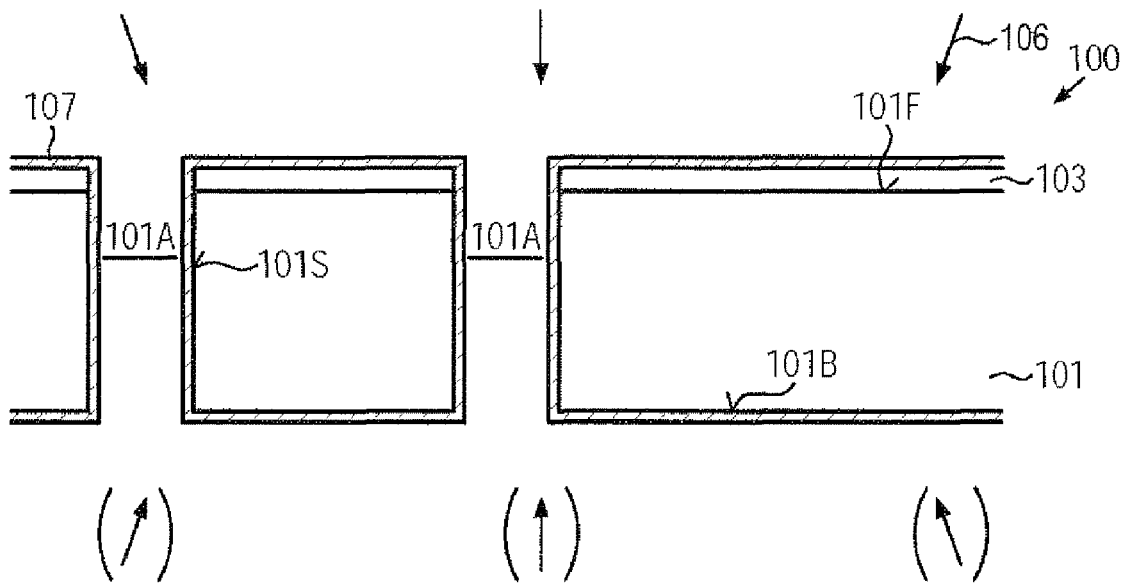

FIG. 1b schematically illustrates the semiconductor device 100 after the etch process 105 of FIG. 1a and during a process 106 for forming an insulating material layer, at least on sidewall portions 101S of openings 101A formed during the etch process 105 of FIG. 1a. In other cases, when the substrate 101 represents an insulating material, the insulating material 107 may not necessarily be formed for the entire depth of the openings 101A but may be restricted to conductive portions, such as a portion extending through the semiconductor layer 103. For instance, the process 106 may represent an oxidation process which may result in a corresponding semiconductor oxide, such as silicon oxide, at least within the substrate 101 and the semiconductor layer 103, while a corresponding insulating oxide may not be necessary in a corresponding buried insulating layer, such as the layer 102 (FIG. 1a), if provided. In other cases, the process 106 may comprise a deposition process for providing any appropriate insulating material with a specified thickness of, for instance, 100 nm and more, wherein the corresponding layer thickness is less critical as long as a reliable coverage of the sidewalls 101S is accomplished. For example, a plurality of insulating materials, such as silicon dioxide, silicon nitride and the like, may be used for which well-established deposition recipes are available. The corresponding process 106 may be readily performed with appropriate process tools, such as a furnace and the like, if a plurality of substrates may commonly be processed while also a deposition may occur from the front side 101F and the back side 101B simultaneously.

Figure 1C:
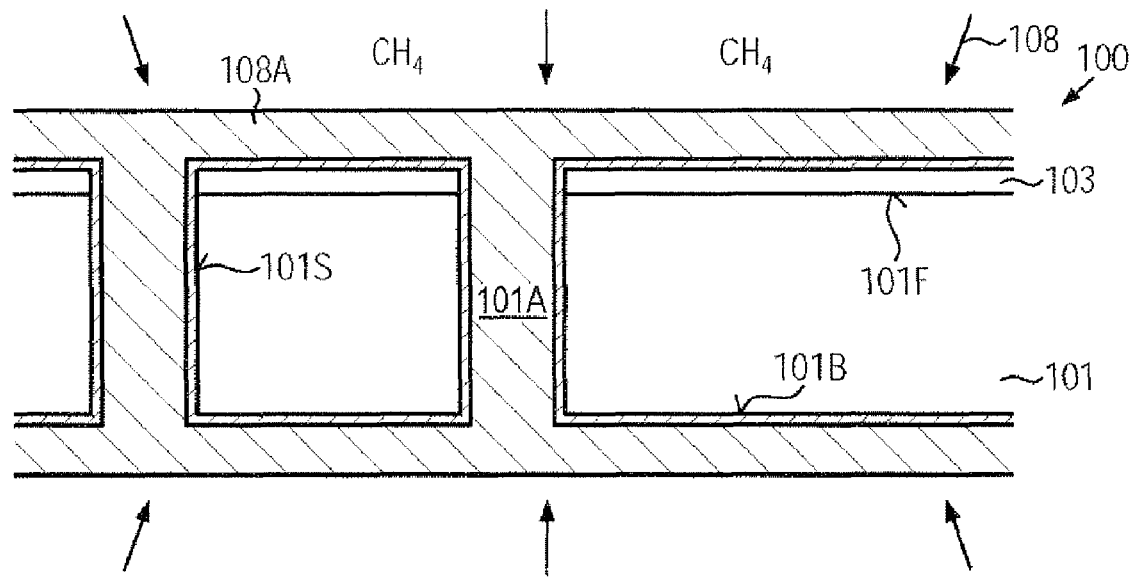

FIG. 1c schematically illustrates the semiconductor device 100 in a further advanced manufacturing stage. As illustrated, the device 100 is exposed to a deposition ambient 108 in order to deposit a carbon-containing material 108A, for instance in the form of substantially pure carbon, or carbon material comprising appropriate dopant species for further enhancing overall conductivity of the material 108A. The deposition process 108 may be performed on the basis of well-established deposition techniques in which a reliable filling of the openings 101A may be accomplished, substantially in a void-free manner by establishing a gaseous ambient in which a hydrocarbon-containing gas precursor may decompose in a highly controllable manner. For instance, the device 100 may be placed in an appropriate deposition tool, such as a furnace, and may be heated to a specific temperature, such as approximately 900-1100° C., possibly by supplying an appropriate carrier gas, such as hydrogen. After a certain degree of temperature stabilization, a carbon-containing precursor gas, such as methane ($CH_4$), may be supplied to establish a certain deposition pressure, which may range from approximately 100 Torr to several hundred Torr, thereby initiating a decomposition of the precursor gas, which may lead to a substantially conformal deposition of carbon material even within the high aspect ratio openings 101A. It should be appreciated that for openings 101A having lateral dimensions approximately 10 μm and even less, a deposition regime may be used in which several deposition steps may be performed with intermediate etch steps so as to preferably remove carbon material at the end portions of the openings 101A in order to obtain a substantially void-free filling after two or more deposition steps with intermediate etch steps. Consequently, after the deposition process 108, the openings 101A may be filled with carbon material, which may possibly include any dopants, such as boron, nitrogen, phosphorous, arsenic and the like, thereby even further enhancing the overall conductivity of the material 108A. In other cases, a substantially pure carbon material may be deposited. The deposition process 108 may be performed on the basis of any appropriate deposition tool, for instance a furnace, in which the substrates may be positioned so as to allow contact of the precursor gas from the front side 101F and the back side 101B, thereby enhancing the gap fill capabilities of the process 108. In other cases, other strategies may be used, for instance a corresponding sacrificial layer may be formed at the back side or at the front side, which may be removed after the deposition process 108. For example, if a corresponding etch stop layer has been provided during the etch process 105 (FIG. 1a), the corresponding layer may still be present and may allow processing in single wafer deposition tools substantially without contaminating any substrate holders and the like.

Figure 1D:
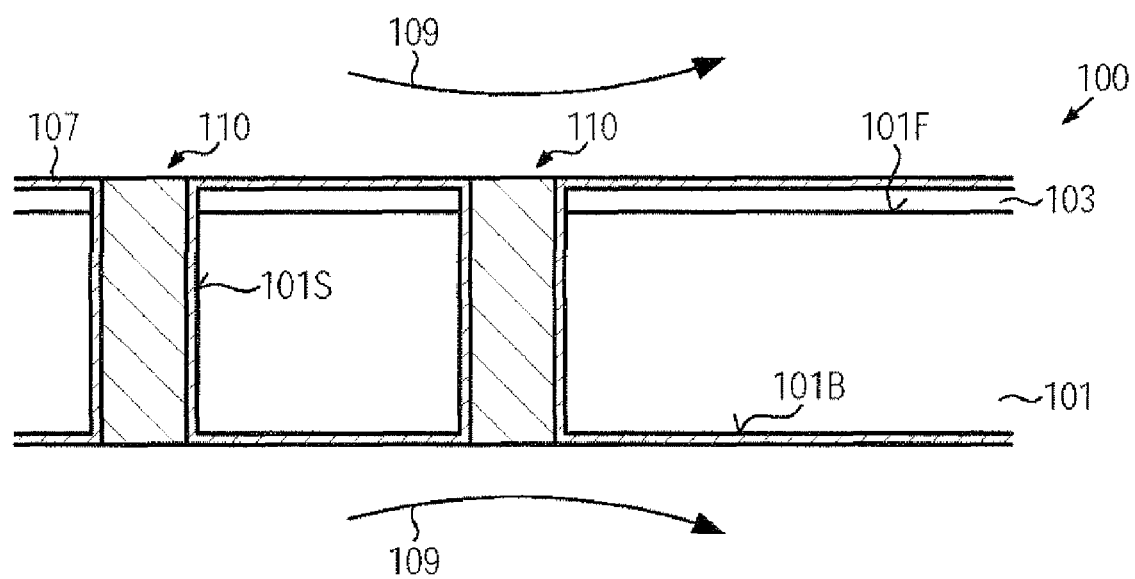

FIG. 1d schematically illustrates the semiconductor device 100 during a removal process 109 to remove any excess material deposited during the process 108 of FIG. 1c. For this purpose, any appropriate process technique may be used, such as plasma assisted etch recipes on the basis of oxygen or hydrogen atmospheres, in which carbon material may be readily removed selectively to other materials, such as silicon dioxide and the like. For instance, a corresponding etch process may be performed and may be stopped in or on the insulating material 107, thereby forming through hole vias 110 which are electrically isolated from each other. In other cases, the removal process 109 may comprise a planarization process including a polishing process, such as a chemical mechanical polishing (CMP) process and the like. The respective removal process 109 may be efficiently performed on the back side 101B and the front side 101F, since the remaining portions of the semiconductor layer 103 may still be protected by the insulating layer 107.

Figure 1E:
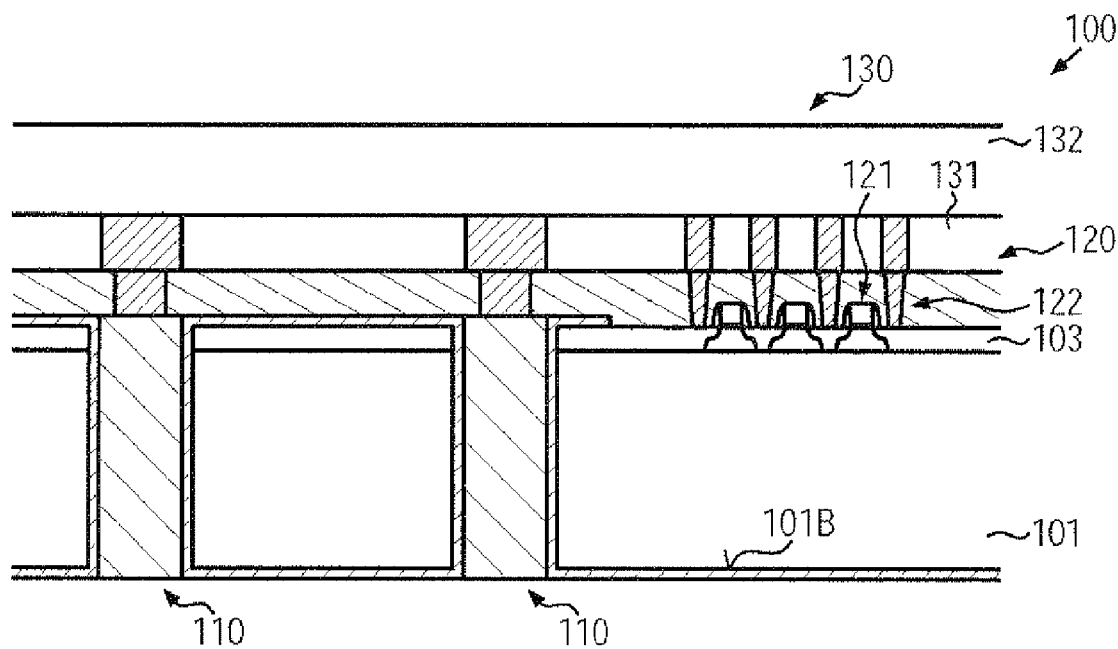
FIG. 1e schematically illustrates a cross-sectional view of the substrate in a further advanced manufacturing stage in which circuit elements and a metallization system may be formed after the fabrication of the through hole vias, according to further illustrative embodiments.

FIG. 1e schematically illustrates the semiconductor device 100 in a further advanced manufacturing stage. As illustrated, the device 100 may comprise a device level 120 which is to be understood as a level providing circuit elements 121 that are formed in and above the semiconductor layer 103. Depending on the overall configuration of the device 100, the circuit elements 121 may represent field effect transistors, bipolar transistors, diode structures, power transistors, resistive structures, capacitors and the like. Furthermore, the device level 120 may include an appropriate contact structure 122, which may connect the circuit elements 121 with a metallization system 130, which may be provided above the device level 120. For instance, the metallization system 130 may comprise one or more metallization layers 131, 132, which may be understood as layers comprising an appropriate dielectric material, in which may be embedded respective metal lines and vias so as to establish a required "wiring network" for the circuit layout under consideration. In addition, the device level 120 and/or the metallization system 130 may also connect to the through hole vias 110 in accordance with the overall circuit layout to allow a connection to peripheral components or other semiconductor devices, which may be fabricated separately from the device 100 and may be attached thereto in a later manufacturing stage to form a three-dimensional chip configuration. For example, in the embodiment shown, the contact structure 122 may connect the through hole vias 110 with one or more of the metallization layers 131, 132, which may then establish the required electrical connection to one or more of the circuit elements 121. In other cases, one or more of the through hole vias 110 may be directly connected to one of the circuit elements 121, for instance via the semiconductor layer 103 or the substrate material 101. For convenience, any such electrical connections are not shown in FIG. 1e.

The semiconductor device 100 as shown in FIG. 1e may be formed on the basis of well-established process techniques with respect to the circuit elements 121 and the metallization system 130. As previously explained, in some embodiments, any critical process steps for forming the circuit elements 121 may be performed after completing the through hole vias 110, while, in other cases, at least some process steps may be performed prior to or during corresponding manufacturing processes, for instance isolation trenches may be formed prior to or during the formation of the through hole vias 110. In still other cases, if desired, the through hole vias 110 may be formed after completing the device level 120 and prior to forming the metallization system 130, since the corresponding manufacturing processes used for forming the through hole vias on the basis of a carbon material may provide a high degree of compatibility with materials and processes used during the formation of the circuit elements 121. For instance, if deemed appropriate, the elevated temperatures used during the deposition of the carbon material of the through hole vias 110 may be used as an anneal process for activating dopants in the device level 120.

Consequently, a highly efficient manufacturing sequence may be accomplished by providing the through hole vias 110 on the basis of a carbon material.

With reference to FIGS. 1f-1j, further illustrative embodiments will now be described in which the through hole vias may be formed by forming openings and removing a portion of the substrate material to obtain the through hole vias extending from the front side to the back side of the substrate of reduced thickness.

Figure 1F:
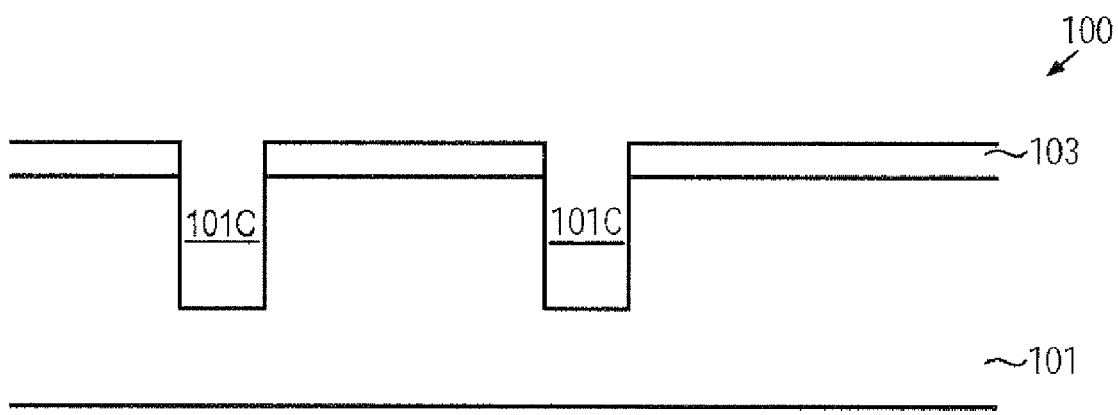
FIGS. 1f-1i schematically illustrate cross-sectional views of a substrate during various manufacturing stages in forming high aspect ratio openings in a substrate material and a subsequent filling of the openings on the basis of a carbon-containing material, according to still further illustrative embodiments.

FIG. 1*f* schematically illustrates the semiconductor device 100 in an early manufacturing stage including respective openings 101C that extend through the semiconductor layer 103 and into the substrate 101 at least to a depth that represents a desired thickness of the substrate 101 of the finalized semiconductor device 100. That is, the openings 101C have a depth at least equal to or greater than a target thickness of the substrate 101 after completing the semiconductor device 100. With respect to forming the openings 101C, the same criteria may apply as previously explained with reference to FIG. 1*a*.

Figure 1G:
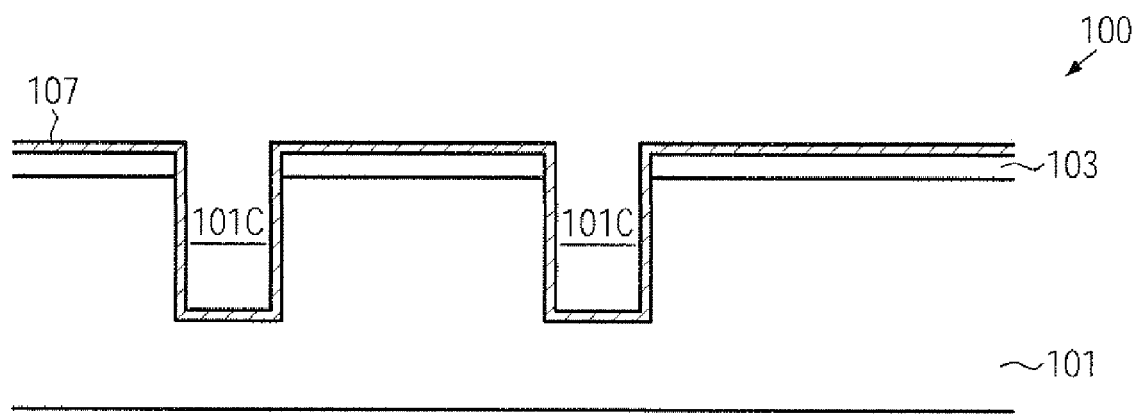

FIG. 1*g* schematically illustrates the semiconductor device 100 after forming the insulating material 107, which may be accomplished by deposition, oxidation and the like, as is also previously explained.

Figure 1H:
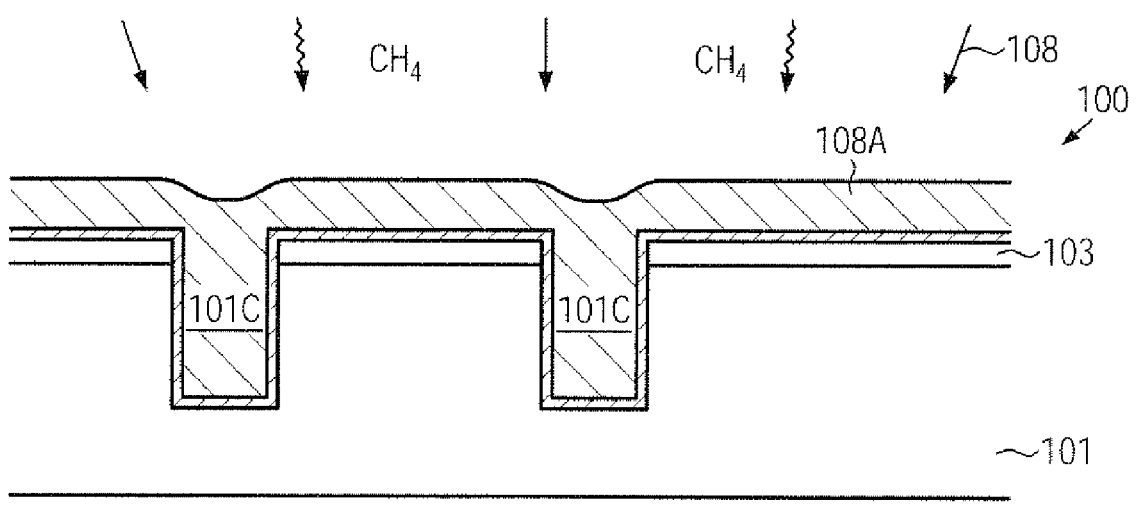

FIG. 1*h* schematically illustrates the semiconductor device 100 during the deposition process 108 to fill the openings 101C with the carbon material 108A, wherein similar process parameters may be used, as previously described. Hence, a reliable filling of the openings 101C may be accomplished, wherein, if required, two or more deposition steps with intermediate etch steps may be used to avoid the creation of any voids, as previously discussed.

Figure 1I:
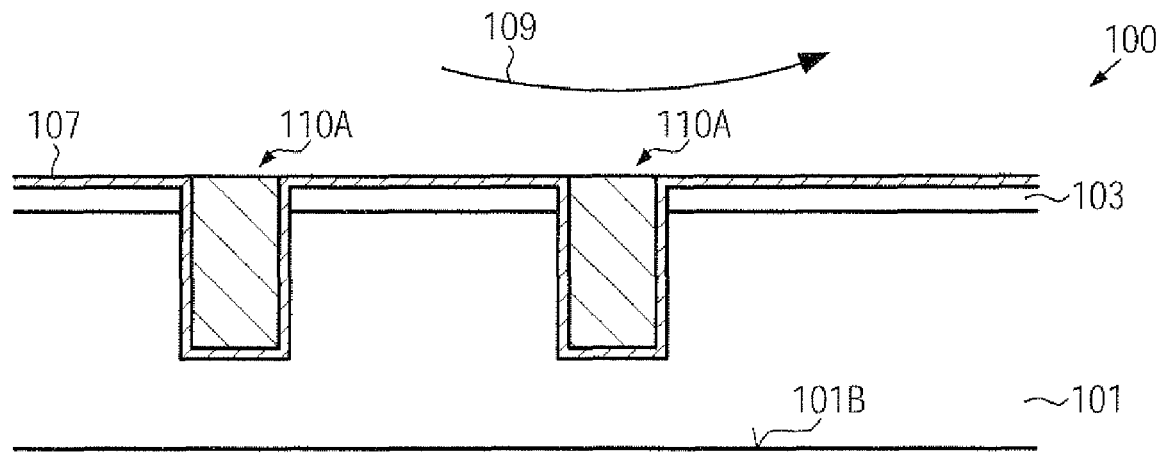

FIG. 1*i* schematically illustrates the semiconductor device 100 during the removal process 109 to remove excess material, thereby forming electrically insulated vias 110A. The removal process 109 may comprise a polishing process, an etch process and the like, as previously explained. In some illustrative embodiments, the further processing may be continued by forming complete circuit elements, possibly in combination with a metallization system, as previously explained with reference to FIG. 1*e*. Consequently, in this case, the corresponding manufacturing processes and substrate handling activities may be performed on the basis of the substrate 101 having its initial thickness, thereby providing enhanced mechanical integrity of the device 100. In other cases, if the substrate 101 having a reduced thickness is considered compatible with the further processing of the semiconductor device 100, material of the substrate 101 may be removed prior to actually completing circuit elements and/or a metallization system.

Figure 1J:
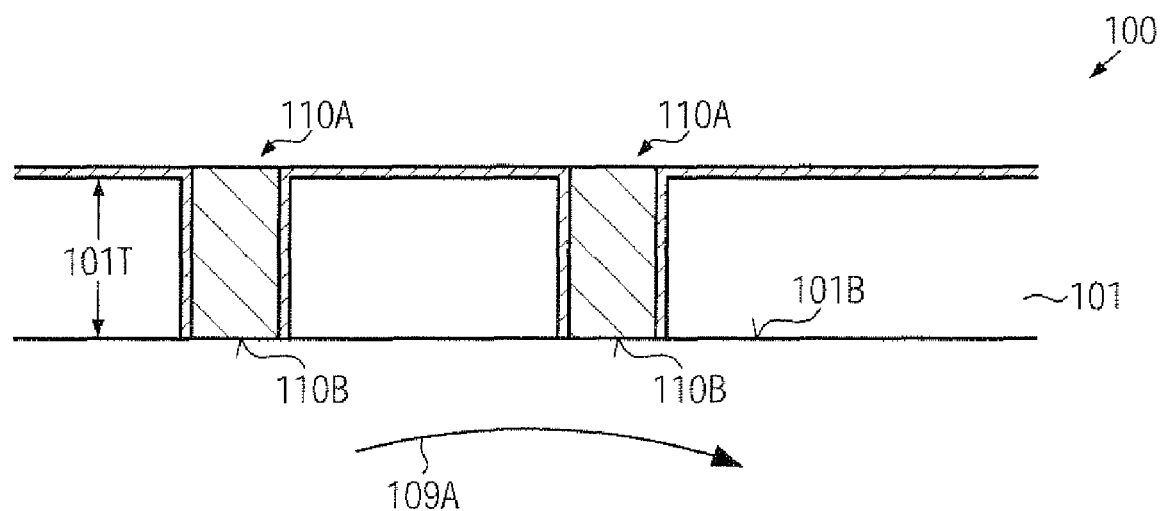
FIG. 1*j* schematically illustrates the substrate in a manufacturing stage in which substrate material may be removed from the back side thereof so as to obtain through hole vias, according to yet other illustrative embodiments.

FIG. 1*j* schematically illustrates the semiconductor device 100 during a process 109A that is designed to remove material of the substrate 101 from the back side thereof, thereby also "opening" the vias 110A, thereby forming the through hole vias by exposing the bottom 110B of the vias 110A. Thus, during the removal process 109A, the desired remaining thickness 101T may be adjusted, wherein the thickness 101T may be varied in accordance with process and device requirements, as long as the initial depth of the vias 110A extends along the thickness 101T. As previously discussed, the removal process 109A, for instance in the form of well-established grinding recipes, may be performed at a very late manufacturing stage so as to maintain the benefit of enhanced mechanical integrity of the substrate 101, while, in other cases, if deemed appropriate, the thinning of the substrate 101 may be implemented at any other stage of the overall manufacturing flow. It should be appreciated that the removal process 109A may even be performed after dicing the substrate 101, if deemed appropriate.

Figure 1K:
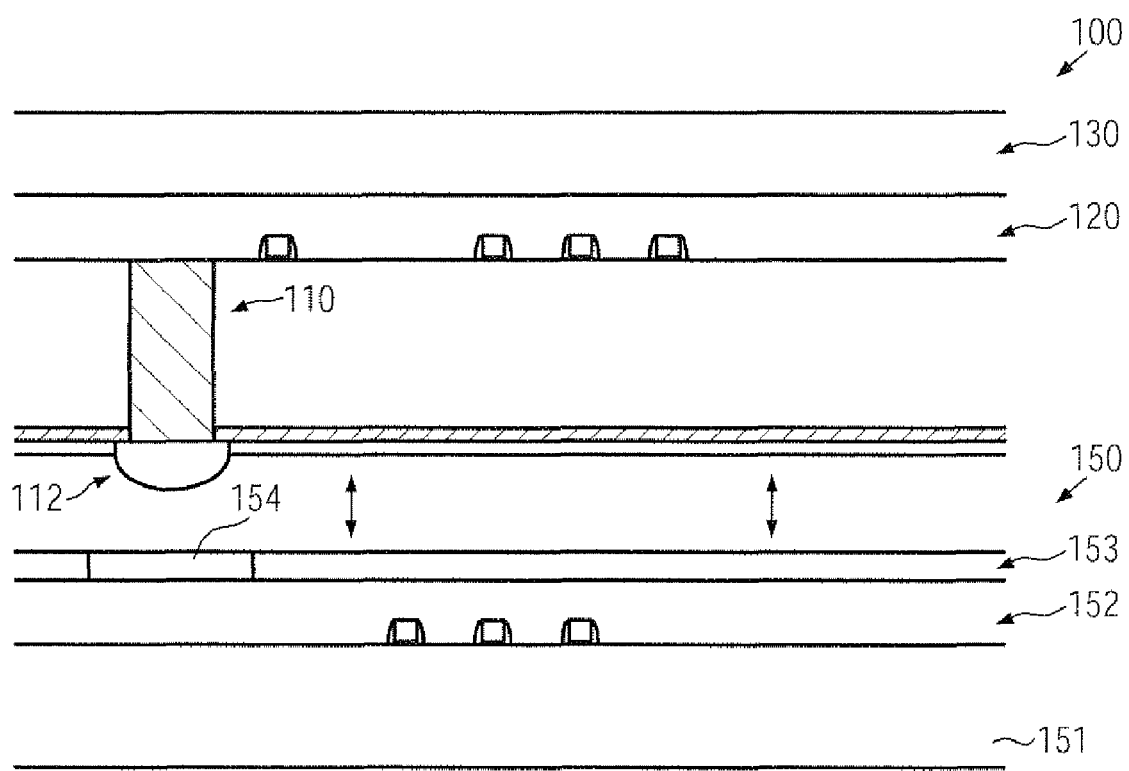
FIG. 1*k* schematically illustrates two separately formed semiconductor devices prior to obtaining a composite device, wherein at least one of the devices comprises a through hole via for electrically connecting both components on the basis of a carbon-containing material, according to still further illustrative embodiments.

FIG. 1*k* schematically illustrates the substrate 100 in a further advanced manufacturing stage when the device 100 is to be combined with another semiconductor device 150, which may also comprise a substrate 151 in combination with a device level 152 and an appropriate metallization system or interconnect structure 153. For example, the interconnect structure of the device 150 may comprise a contact pad 154 that is to be brought into contact with a bump structure 112 that may be connected to the through hole vias 110. Consequently, after mechanically contacting the devices 100 and 150, the bump structure 112 may be reflowed to form a mechanical and electrical connection to the pad 154. In other cases, appropriate adhesives may be applied for mechanically and electrically connecting the devices 100, 150 in accordance with well-established techniques. It should be appreciated that the stacked configuration formed by the devices 100, 150 may be accomplished in any appropriate manner, that is, the through hole vias 110 may connect to the interconnect structure 153 or may connect to a corresponding through hole via system formed in the substrate 151 (not shown) of the device 150, depending on the overall requirements. Since the through hole vias 110 may provide an efficient space-saving interconnect system between the devices 100 and 150, sophisticated stacked three-dimensional chip configurations may be established within a single package, thereby enabling a significant enhancement of the overall three-dimensional packing density.

As a result, the present disclosure provides techniques and semiconductor devices in which through hole vias may be efficiently formed on the basis of a carbon material, thereby providing a high degree of compatibility and flexibility with respect to manufacturing techniques used for forming circuit elements and metallization systems while on the other hand providing superior electrical performance compared to, for instance, polysilicon-based through hole interconnect structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an opening in a substrate of a semiconductor device prior to forming circuit elements in or above a front side of said substrate, said opening extending from the front side of said substrate to a back side of said substrate;
    forming an insulating layer on sidewalls of said opening prior to filling in said opening with a conductive material;
    filling said opening with said conductive material, said conductive material comprising carbon; and
    forming circuit elements in and above said front side of the substrate.

2. The method of claim 1, wherein said opening is filled with said conductive material prior to forming said circuit elements.

3. A method, comprising:
    forming an opening in a substrate of a semiconductor device prior to forming circuit elements in or above a front side of said substrate, said opening extending from the front side of said substrate to a back side of said substrate;

forming an insulating layer on sidewalls of said opening prior to filling in said opening with a conductive material;

filling said opening with said conductive material, said conductive material comprising carbon;

removing excess material of said conductive material above said back side and said front side by at least one of performing an etch process and performing a mechanical planarization process, wherein said excess material is removed from said front side and said backside prior to forming said circuit elements in or above the front side of said substrate; and forming circuit elements in and above said front side of the substrate.

4. The method of claim 1, further comprising forming a metallization system above said circuit elements, wherein said opening is formed prior to forming said metallization system.

5. The method of claim 4, further comprising forming second circuit elements in a second semiconductor layer formed above a second substrate and forming a stacked configuration with said substrate by attaching one of said first substrate and a material layer formed above said front side of the first substrate to one of said second substrate and a material layer formed above said second substrate.

6. The method of claim 1, further comprising introducing a dopant species in said conductive fill material.

7. A method, comprising:
forming an opening into a front side of a substrate of a semiconductor device, prior to forming circuit elements in or above said front side of said substrate, said opening extending into said substrate;

forming an insulating layer on sidewalls of said opening prior to filling said opening with a carbon-containing conductive material filling said opening with said carbon-containing conductive material;

removing material of said substrate from a back side thereof to expose a bottom of said opening and said carbon-containing conductive material; and forming circuit elements above said front side after removing said material of said substrate from the back side.

8. The method of claim 7, wherein said opening is formed prior to forming circuit elements above said front side.

9. The method of claim 7, wherein removing material of said substrate from a back side thereof is performed prior to forming circuit elements.

10. The method of claim 7, wherein removing material of said substrate from a back side thereof is performed after forming circuit elements.

11. The method of claim 10, further comprising forming a metallization system above said circuit elements, wherein removing material of said substrate from a back side thereof is performed after forming said metallization system.

12. The method of claim 7, wherein said opening extends at least to one half of an initial thickness of said substrate.

13. The method of claim 1, wherein forming the insulating layer on the sidewalls of said opening comprises forming the insulating layer only one conductive portions of the opening.

14. the method of claim 1, wherein forming the insulating layer on the sidewalls of the opening comprises forming the insulating layer only on portions of the opening extending through a semiconductor layer formed on the substrate.

15. The method of claim 7, wherein forming the insulating layer on the sidewalls of said opening comprises forming the insulating layer only one conductive portions of the opening.

16. the method of claim 7, wherein forming the insulating layer on the sidewalls of the opening comprises forming the insulating layer only on portions of the opening extending through a semiconductor layer formed on the substrate.

* * * * *